(12) United States Patent
Mastantuono et al.

(10) Patent No.: US 9,407,478 B1
(45) Date of Patent: Aug. 2, 2016

(54) LOW POWER AND AREA BOOTSTRAPPED PASSIVE MIXER WITH SHARED CAPACITANCES

(71) Applicant: Telefonaktiebolaget L M Ericsson (publ), Stockholm (SE)

(72) Inventors: Daniele Mastantuono, Lund (SE); Sven Mattisson, Bjärred (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 14/838,044

(22) Filed: Aug. 27, 2015

(51) Int. Cl.
   *H03D 7/14* (2006.01)
   *H04L 25/08* (2006.01)
   *H04B 1/10* (2006.01)

(52) U.S. Cl.
   CPC .............. *H04L 25/08* (2013.01); *H03D 7/1441* (2013.01); *H03D 7/1466* (2013.01); *H04B 1/10* (2013.01)

(58) Field of Classification Search
   CPC ... H03D 7/125; H03D 7/1441; H03D 7/1458; H03D 7/1466; H03D 7/1491; H04B 1/10; H04B 1/26; H04B 1/28; H04L 25/08
   See application file for complete search history.

(56) References Cited

U.S. PATENT DOCUMENTS

| | | | |
|---|---|---|---|
| 6,072,355 A | 6/2000 | Bledsoe | |
| 7,279,940 B1 | 10/2007 | Min | |
| 7,372,392 B1 | 5/2008 | Wan et al. | |
| 8,847,662 B2* | 9/2014 | Chiu | H03D 7/1491 327/355 |
| 9,218,513 B2* | 12/2015 | Winiecki | G06G 7/12 |
| 2003/0016070 A1 | 1/2003 | Yang | |
| 2005/0073351 A1 | 4/2005 | Ko et al. | |
| 2005/0164669 A1 | 7/2005 | Molnar et al. | |
| 2007/0072576 A1* | 3/2007 | Sjoland | H03D 7/125 455/323 |
| 2010/0176857 A1 | 7/2010 | Kong et al. | |
| 2010/0317308 A1 | 12/2010 | Mirzaei et al. | |
| 2012/0252374 A1 | 10/2012 | Mattisson et al. | |
| 2013/0141261 A1 | 6/2013 | Johancsik et al. | |
| 2013/0234870 A1 | 9/2013 | Haque et al. | |
| 2014/0378077 A1 | 12/2014 | Din et al. | |

FOREIGN PATENT DOCUMENTS

| | | |
|---|---|---|
| CN | 103532534 A | 1/2014 |
| JP | S57127307 A | 8/1982 |

OTHER PUBLICATIONS

Chen et al. A High-performance Bootstrap Switch for Low Voltage Switched-Capacitor Circuits. 2014 IEEE International Symposium on Radio-Frequency Integration Technology, TH3B-3, pp. 1-3.
Chen et al. Optimization of Sample Hold Circuit for High-Speed and High-Resolution ADCs, ISIC, 2009.

* cited by examiner

*Primary Examiner* — David B. Lugo
(74) *Attorney, Agent, or Firm* — Coats & Bennett, PLLC

(57) ABSTRACT

In a passive mixer, switches and a capacitance are shared between bootstrapped mixing transistors, reducing the number of components required as compared to prior art bootstrap designs. Shared bootstrap circuits operate in an interleaved fashion between I and Q mixer circuits, at twice the LO frequency. That is, the shared bootstrap circuits in each I mixer circuit charge their capacitors in a first half-period of a clock, and connect the shared capacitor to the gate of an enabled mixing transistor in the second half-period. The shared bootstrap circuits in the Q mixer circuit charge their capacitors in the second half-period, and connect the shared capacitor to the gate of an enabled mixing transistor in the first half-period. One of two mixing transistors connected to each shared bootstrap circuit is alternately enabled during the clock signal half-periods that the shared bootstrap circuit is not charging its capacitor.

16 Claims, 6 Drawing Sheets

LOW POWER AND AREA BOOTSTRAPPED PASSIVE MIXER WITH SHARED CAPACITANCES

FIELD OF INVENTION

The present invention relates generally to frequency conversion mixer circuits, and in particular to an efficient, bootstrapped, passive, current driven, differential, frequency conversion IQ mixer that shares bootstrap capacitances among a plurality of mixing transistors.

BACKGROUND

The most common form of wireless communication involves the modulation of information onto a carrier wave of electromagnetic radiation at so-called radio frequency, or RF (generally, in the range 3 KHz to 300 GHz). A critical operation in the transmission and reception of information via RF carriers is frequency up-conversion and down-conversion, respectively. Accordingly, a key circuit component in a transmitter or receiver is a frequency mixer. A mixer is a nonlinear electrical circuit that shifts an information signal from one frequency to another, also known as heterodyning. For example, a mixer in a receiver may convert a signal at an RF frequency $f_{RF}$ by mixing it with a lower frequency signal from a Local Oscillator $f_{LO}$, yielding the heterodynes $(f_{RF}+f_{LO})$ and $(f_{RF}-f_{LO})$. The former of these is typically discarded by filtering, and the latter is amplified and processed. In a superheterodyne receiver, the recovered signal is an Intermediate Frequency (IF) signal, which may undergo another frequency down-conversion before information is extracted from it. Direct conversion receivers convert an RF signal directly to DC, generating a Baseband (BB) signal, using only one frequency mixing operation. Mixers are also used in transmitters to up-convert a modulated signal to a desired RF transmission frequency. However, for simplicity and clarity, embodiments of the present invention are explained herein in the context of a receiver, frequency down-converting an RF signal.

Modern mixer design is challenging. Requirements of high bandwidth and high Signal to Noise and Distortion Ratio (SNDR) become more stringent with each generation of wireless communication protocols (e.g., 5G). Additionally, all circuits in portable, battery-powered devices, such as smartphones and other User Equipment operative in wireless communication networks, have limited silicon area and strict power budgets. A passive mixer architecture is popular in many receiver designs, due to its intrinsic wide bandwidth, low power, and low noise.

A passive mixer can be deployed as a frequency down-converting stage in a direct conversion receiver, where it becomes a critical block for the linearity of the receiver chain. Nonlinearity of switching transistors in a down-conversion mixer is a known source of distortion, particularly second and third order distortion. Accordingly, numerous approaches have been developed to improve linearity. In one such technique, known as bootstrapping, the gate terminal of a transistor is driven with a higher voltage that depends on the input (and/or output) signal, to approach a constant (signal independent) on-resistance. For example, if a transistor receives a voltage of $V_{DD}+V_{in}$ at the gate terminal, and an input signal voltage of $V_{in}$ at the source terminal, then the gate-to-source voltage is $V_{gs}=V_g-V_s=(V_{DD}+V_{in})-V_{in}=V_{DD}$, a constant value. A constant $V_{gs}$ over all input voltages reduces signal modulation of the on-resistance in the transistor conduction channel. Bootstrap circuits solve two problems associated with a one-transistor switch: the limited input range due to the threshold voltage, and the switch resistance variation. For more information, see Chen, et al., "A High-performance Bootstrap Switch for Low Voltage Switched-Capacitor Circuits," 2014 IEEE International Symposium on Radio-Frequency Integration Technology (2014), the disclosure of which is incorporate herein by reference in its entirety.

The combination of a passive, current driven mixer and bootstrapping the mixing transistors in the mixer is known to reduce the nonlinearities of a receiver. Also, as well known in the electronic arts, improved performance, stability, linearity, and noise immunity may be achieved by implementing circuits in a differential configuration. That is, rather than representing a signal value as a single voltage referenced to ground (single-ended), the circuit is configured as mirror-image positive and negative sub-circuits, and the signal value is represented as the difference of two voltages. As used herein, with respect to differential circuits, the terms "positive" and "negative" are terms of reference used to identify the two complimentary halves of a differential circuit, or the dual inputs or outputs (e.g., "positive input" or "negative output"). The terms do not indicate any value of a voltage with respect to zero volts.

FIG. 1 depicts one known configuration of a bootstrapped, passive, current driven, differential, frequency conversion IQ mixer. Differential RF inputs RFN and RFP are input to two differential pairs of mixing transistors in each of In-phase (I) and Quadrature (Q) mixer circuits. The mixing transistors are clocked with Local Oscillator (LO) clocks LOPI, LONI, LOPQ and LONQ. The Q clock signals are phase-shifted from the I clock signals by 90°. Operation of the IQ mixer is well known in the art and is not further described herein. The mixing transistors are bootstrapped for improved linearity. In the circuit of FIG. 1, this comprises buffering the positive and negative RF inputs, each buffer having a gain $\alpha_{BOOT}$, and adding the buffered input to the LO clock signal prior to the gate terminal of the mixing transistors. The gate terminals of the transistors are thus driven with a higher voltage that varies with the input signal, maintaining a more constant $V_{gs}$ and hence on-resistance.

Due to the current driven architecture, the base band circuits provide a very low load impedance at the mixer output, reducing significantly the mixer output voltage swing. This makes a bootstrap by the output IF signal superfluous.

FIG. 2 depicts a conceptual view of one technique to bootstrap a mixing transistor. FIG. 2 depicts a capacitor C1; the mixing transistor, with parasitic capacitance $C_P$ and equivalent on-resistance $R_{on}$; and idealized switches SW1-SW5, operated by different phases of a clocking signal. During a first phase ϕ1 of the clock signal, switches SW1, SW2, and SW4 are closed, and switches SW3 and SW5 are open. This connects the capacitor C1 across the supply voltage, charging it, and grounds the gate of the mixing transistor, turning it off. During the alternate phase ϕ2 of the clock, switches SW1 and SW2 open, disconnecting the capacitor C1 from the supply voltage, and switch SW4 opens to remove the ground from the gate of the transistor. Meanwhile, switches SW3 and SW5 close, connecting the capacitor C1 between the source terminal of the transistor (where the input voltage $V_{in}$ is applied) and the gate terminal. This applies to the gate terminal the sum of the (unbuffered) input voltage $V_{in}$ and the voltage on the capacitor, which is the supply voltage; hence $V_g=V_{DD}+V_{in}$. As discussed above, the gate-to-source voltage $V_{gs}$ is $V_g-V_s=(V_{DD}+V_{in})-V_{in}=V_{DD}$. Hence, $V_{gs}$, and the transistor equivalent on-resistance $R_{on}$, is largely constant, and independent of the input signal, yielding very good linearity.

FIG. 3 depicts a schematic implementing the conceptual view of FIG. 2. The signal Clk_N is the inverted signal of Clk.

During a first phase, when Clk=1 and Clk_N=0, the capacitor C1 is charged to the supply voltage value by M1 and M2 being closed (and M3 and M5 being open to isolate C1 from the transistor), and the mixing transistor is off due to M4 being closed and grounding the gate terminal. During the opposite phase, when Clk=0 and Clk_N=1, the capacitor C1 is disconnected from the power rails and connected between the buffer and gate terminal of the mixing transistor. This applies to the gate terminal the sum of the supply voltage (on the capacitor) and the amplified input voltage $\alpha_{BOOT}*V_{RF}$. The amplification by $\alpha_{BOOT}$ (nominally 0.5) is required in applying this bootstrap technique to a passive mixer to obtain the desired amplitude of signal to linearize the mixing transistor, and to reduce crosstalk.

To implement the bootstrapping of mixing transistors depicted in FIG. 3 into the passive mixer circuit of FIG. 1 would require one switch network (M1-M5), one capacitance, and one active stage (buffer) for each mixing transistor. This would necessarily entail:

- Additional capacitance at the input of the passive mixer switch proportional to the number of buffering stages, introducing loss in the signal path;
- Additional power for each buffering stage and number of switches to be driven by the clock circuits;
- Additional complexity in the clock (and inverse clock) distribution;
- Additional silicon area due to the buffering stage and bootstrap switch network and capacitance for each switch of the passive mixer; and
- Additional mismatch sources, contributing to the even order differential-mode distortion.

The Background section of this document is provided to place embodiments of the present invention in technological and operational context, to assist those of skill in the art in understanding their scope and utility. Approaches descried in the Background section could be pursued, but are not necessarily approaches that have been previously conceived or pursued. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of embodiments of the invention or to delineate the scope of the invention. The sole purpose of this summary is to present some concepts disclosed herein in a simplified form as a prelude to the more detailed description that is presented later.

According to one or more embodiments described and claimed herein, several switches and the capacitance required to implement bootstrapping in a passive mixer design are shared between bootstrapped mixing transistors, resulting in two buffers and four shared bootstrap circuits for the eight mixing transistors of a differential IQ mixer. The shared bootstrap circuits operate in an interleaved fashion between I and Q mixer circuits, at twice the LO frequency. That is, the shared bootstrap circuits in the I mixer circuit charge their capacitors in a first half-period of a clock, and connect the shared capacitor to the gate of an enabled mixing transistor in the second half-period. The shared bootstrap circuits in the Q mixer circuit charge their capacitors in the second half-period, and connect the shared capacitor to the gate of an enabled mixing transistor in the first half-period. One of two mixing transistors connected to each shared bootstrap circuit is alternately enabled during the clock signal half-periods that the shared bootstrap circuit is not charging its capacitor. Each shared bootstrap circuit and its connected mixing transistors thus require two full periods of the clock signal to operate: charge—bootstrap first switch—charge—bootstrap second switch.

One embodiment relates to a bootstrapped, passive, differential, frequency conversion IQ mixer. The mixer includes two buffers having a predetermined gain. Each buffer is connected to one of positive and negative differential mixer inputs. The mixer comprises differential In-phase (I) and Quadrature (Q) mixer circuits. Each mixer circuit includes two differential pairs of mixing transistors, with each pair comprising a positive and negative mixing transistor, and two shared bootstrap circuits. Each bootstrap circuit includes a capacitor, and it is interposed between a different buffer and one pair of mixing transistors. The shared bootstrap circuits in the I mixer circuit are each operative to charge their capacitor during each first half-period of a clock signal. During each second half-period of the clock signal, each shared bootstrap circuit is operative to bootstrap an enabled one of the mixing transistors of the connected pair by connecting the charged capacitor between the connected buffer and a gate terminal of the enabled mixing transistor. Similarly, the shared bootstrap circuits in the Q mixer circuit are each operative to charge their capacitor during each second half-period of the clock signal. During each second half-period of the clock signal, each shared bootstrap circuit is operative to bootstrap an enabled one of the mixing transistors of the connected pair by connecting the charged capacitor between the connected buffer and a gate terminal of the enabled mixing transistor. During each alternate half-period of the clock signal in which the connected shared bootstrap circuit is not charging its capacitor, first the positive mixing transistors of the two pair in each of the I and Q mixer circuits are enabled, and then both negative mixing transistors of the two pair in each of the I and Q mixer circuits are enabled.

Another embodiment relates to a bootstrapped, passive, differential, frequency conversion IQ mixer having differential mixer inputs, differential In-phase (I) outputs, and differential Quadrature (Q) outputs. The mixer includes a first pair of mixing transistors arranged in a differential configuration and receiving a negative mixer input and generating differential I outputs; a second pair of mixing transistors arranged in a differential configuration and receiving a positive mixer input and generating differential I outputs; a third pair of mixing transistors arranged in a differential configuration and receiving a negative mixer input and generating differential Q outputs; and a fourth pair of mixing transistors arranged in a differential configuration and receiving a positive mixer input and generating differential Q outputs. The mixer also includes a first buffer having a predetermined gain and connected to the negative mixer input; and a second buffer having the predetermined gain and connected to the positive mixer input. The mixer further includes a clock generator circuit operative to generate a clock signal having first and second half-periods, of opposite polarity, during each period. The mixer additionally includes a first shared bootstrap circuit comprising a first capacitor, and operative to charge the first capacitor to a supply voltage value during the first half-period the clock signal, and operative to connect the first capacitor between the first buffer and a gate terminal of an enabled one of the first pair of mixing transistors during the second half-period of the clock signal; a second shared bootstrap circuit comprising a second capacitor, and operative to charge the second capacitor to the supply voltage value during the first half-period of the clock signal, and operative to connect the second capacitor between the second buffer and a gate terminal of an enabled one of the second pair of mixing transistors during the second half-period of the clock signal; a third shared bootstrap circuit comprising a third capacitor, and operative to charge the third capacitor to the supply voltage value during the second half-period of the clock signal, and operative to connect the third capacitor between the first buffer and a gate terminal of an enabled one of the third pair of mixing transistors during the first half-period of the clock signal; and a fourth shared bootstrap circuit comprising a fourth capacitor, and operative to charge the fourth capacitor to the supply voltage value during the second half-period of the clock signal, and operative to connect the fourth capacitor between the second buffer and a gate terminal of an enabled one of the fourth pair of mixing transistors during the first half-period of the clock signal. The clock generator circuit is further operative to generate first, second, third, and fourth enable signals, each active for one different half-period of every two successive periods of the clock signal. The first enable signal is operative to alternately enable a positive mixing transistor of the first pair and the second pair; the second enable signal is operative to alternately enable a negative mixing transistor of the first pair and the second pair; the third enable signal is operative to alternately enable a positive mixing transistor of the third pair and the fourth pair; and the fourth enable signal is operative to alternately enable a negative mixing transistor of the third pair and the fourth pair.

Yet another embodiment relates to a method of operating a bootstrapped, passive, differential, frequency conversion IQ mixer comprising first and second shared bootstrap circuits in an In-phase (I) mixing circuit, and third and fourth shared bootstrap circuits in a Quadrature (Q) mixing circuit, wherein each shared bootstrap circuit includes a capacitor and is connected between one of two input buffers and a one of four differential pairs of mixing transistors. During a first half-period of a clock signal the first and second shared bootstrap circuits are configured to charge their respective capacitors and the third and fourth shared bootstrap circuits are simultaneously configured to connect their capacitors between the connected buffer and a gate terminal of an enabled one of the connected mixing transistors. During an opposite, second half-period of the clock signal, the first and second shared bootstrap circuits are configured to connect their capacitors between the connected buffer and a gate terminal of an enabled one of the connected mixing transistors and the third and fourth shared bootstrap circuits are simultaneously configured to charge their respective capacitors. During each alternate half-period of the clock signal in which the connected shared bootstrap circuit is not charging its capacitor, first the positive mixing transistors of the two pair in each of the I and Q mixer circuits are enabled, and then both negative mixing transistors of the two pair in each of the I and Q mixer circuits are enabled.

BRIEF DESCRIPTION OF THE DRAWINGS

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

DETAILED DESCRIPTION

U.S. patent application Ser. No. 14/838,012, titled, "Shared Circuit Configurations for Bootstrapped Sample and Hold Circuits in a Time-Interleaved Analog to Digital Converter," assigned to assignee of the present application and filed concurrently herewith, discloses another application of shared circuits in the bootstrap operation of transistors, and its disclosure is incorporated herein by reference, in its entirety.

U.S. patent application Ser. No. 13/503,168, titled, "Passive Mixer with Reduced Second Order Intermodulation," filed Oct. 23, 2009, assigned to assignee of the present application, discloses another technique of configuring and operating mixing transistors, and its disclosure is incorporated herein by reference, in its entirety.

For simplicity and illustrative purposes, the present invention is described by referring mainly to an exemplary embodiment thereof. In the following description, numerous specific details are set forth in order to provide a thorough understanding of the present invention. However, it will be readily apparent to one of ordinary skill in the art that the present invention may be practiced without limitation to these specific details. In this description, well known methods and structures have not been described in detail so as not to unnecessarily obscure the present invention.

Figure 3:
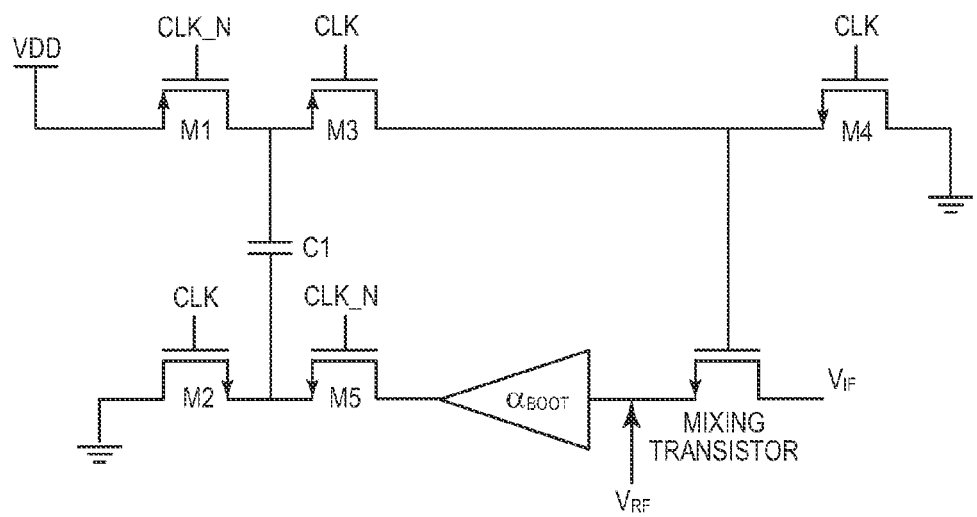
FIG. 3 is a schematic diagram of a prior art circuit implementing the bootstrap of FIG. 2.
Figure 4:
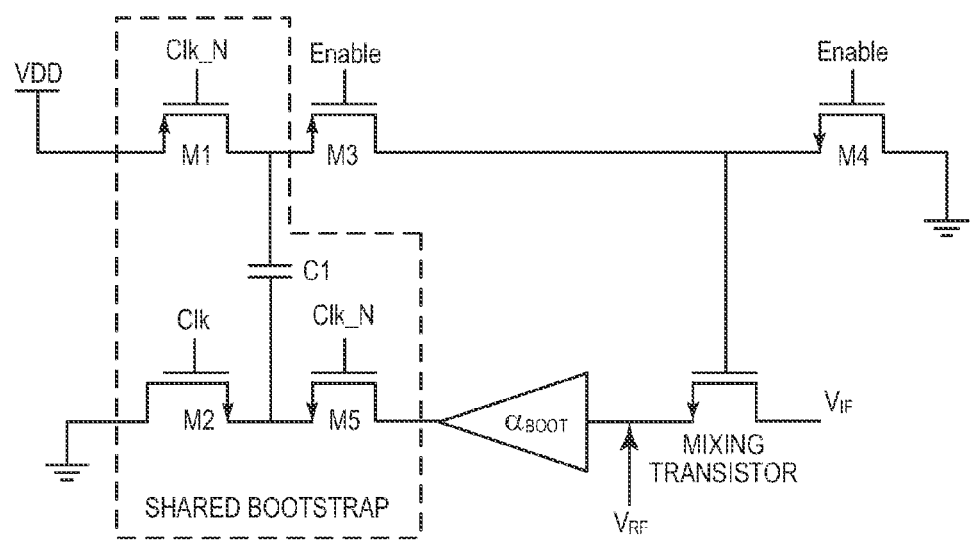
FIG. 4 is a schematic diagram depicting which components for bootstrapped transistors may be shared.

FIG. 4, which is similar to the circuit of FIG. 3, depicts which portion of an individual bootstrapped mixing transistor circuit may be shared between two (or more) mixing transistors. As indicated, the capacitor C1, the capacitor charging switches M1 and M2, and the buffered input isolation switch M5 may be shared between, e.g., two mixing transistors. The enabling switches M3 and M4 must be unique to each mixing transistor, so that it may be enabled independently of any other. As discussed more fully herein, the input buffer can be shared not only among multiple mixing transistors, but also between shared bootstrap circuits.

Figure 5:
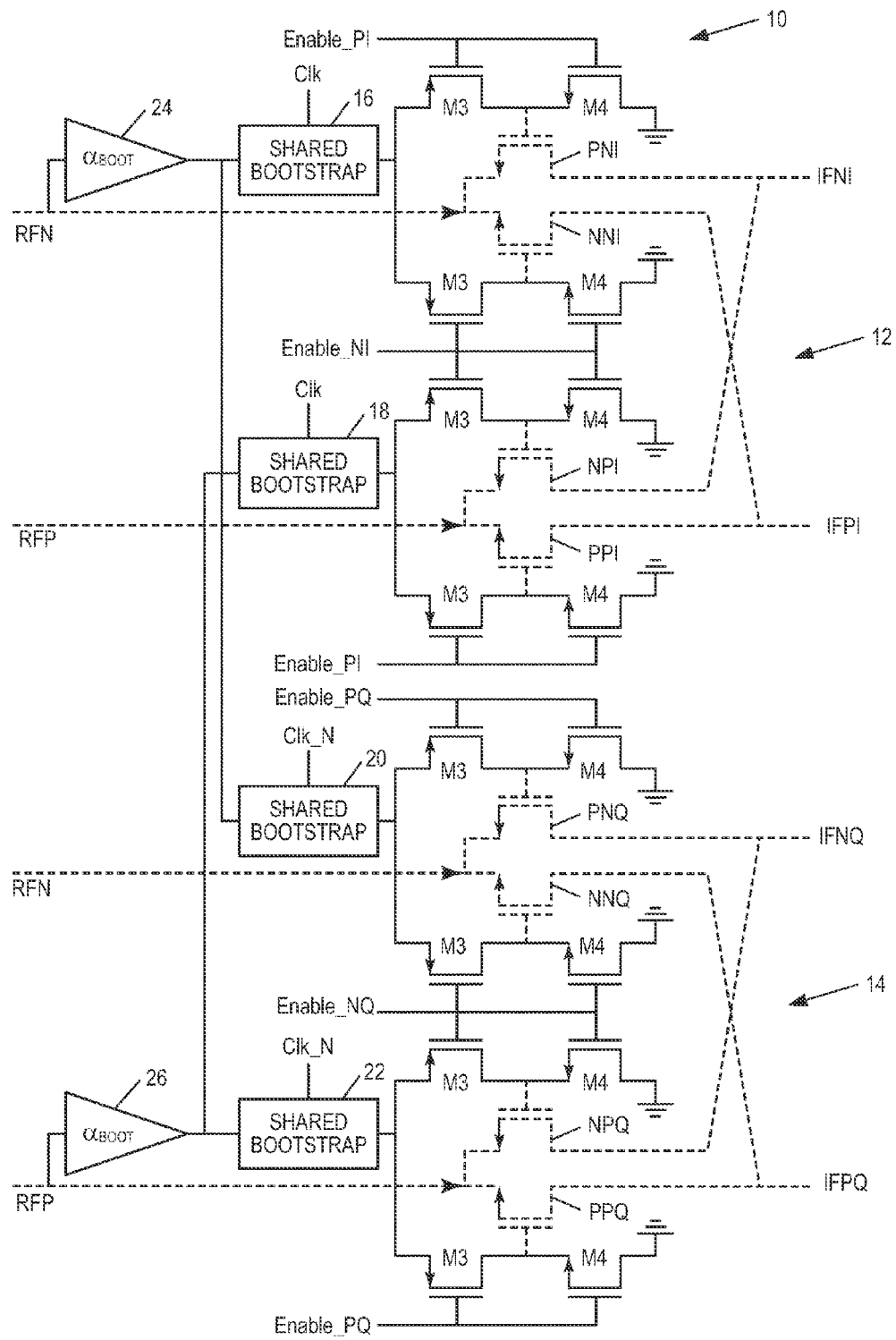
FIG. 5 is a schematic diagram of a bootstrapped, passive, differential, IQ mixer circuit with shared bootstrap circuits.

FIG. 5 depicts an efficient, bootstrapped, passive, current driven, differential, frequency conversion IQ mixer 10 that shares a bootstrap capacitance among a plurality of mixing transistors. The mixer 10 includes both a differential In-phase (I) mixer circuit 12 and a differential Quadrature (Q) mixer circuit 14. Each of the I and Q mixer circuits 12, 14, comprises two pairs of differentially connected mixing transistors, one pair receiving a negative differential mixer input RFN and one pair receiving a positive differential mixer input RFP. To distinguish the inventive shared bootstrapping from conventional mixer architecture, the mixer inputs, mixing transistors, and IF outputs are depicted in dashed lines; the bootstrapping components and circuits are depicted in solid lines. The eight mixing transistors are referenced by a three-letter code. The convention for the reference codes of the mixing transistors is, in order from left to right: (1) negative (N) or positive (P) transistor within a differential pair; (2) negative (N) or positive (P) pair within the I or Q mixer (that is, which differential RF input the pair is connected to); and (3) I mixer circuit 12 or Q mixer circuit 14.

Four shared bootstrap circuits 16, 18, 20, 22 are connected to the four differential pairs of mixing transistors. The shared bootstrap circuits 16, 18, 20, 22 each share a bootstrap capacitance (not shown in FIG. 5) between the two mixing transistors in each respectively connected differential pair. Active buffers 24, 26 are each interposed between a mixer input RFN, RFP and the corresponding negative or positive shared bootstrap circuit 16, 18, 20, 22, respectively. Because the I and Q shared bootstrap circuits 16, 18 and 20, 22 operate in an interleaved fashion (as more fully explained herein), a single buffer 24, 26 may be shared between two shared bootstrap circuits 16, 20 and 18, 22, respectively. Stated differently, the buffers 24, 26 are continuously active, but the I mixer shared bootstrap circuits 16, 18 connect the buffered mixer inputs to the I mixing transistors on opposite phases of a clock signal than the shared bootstrap circuits 20, 22 connect the buffered mixer inputs to the Q mixing transistors. In one embodiment, the buffers both have a predetermined gain $\alpha_{BOOT}$=0.5. The value of $\alpha_{BOOT}$ may be varied to optimize the bootstrap operation for linearity at a given frequency.

Figure 6:
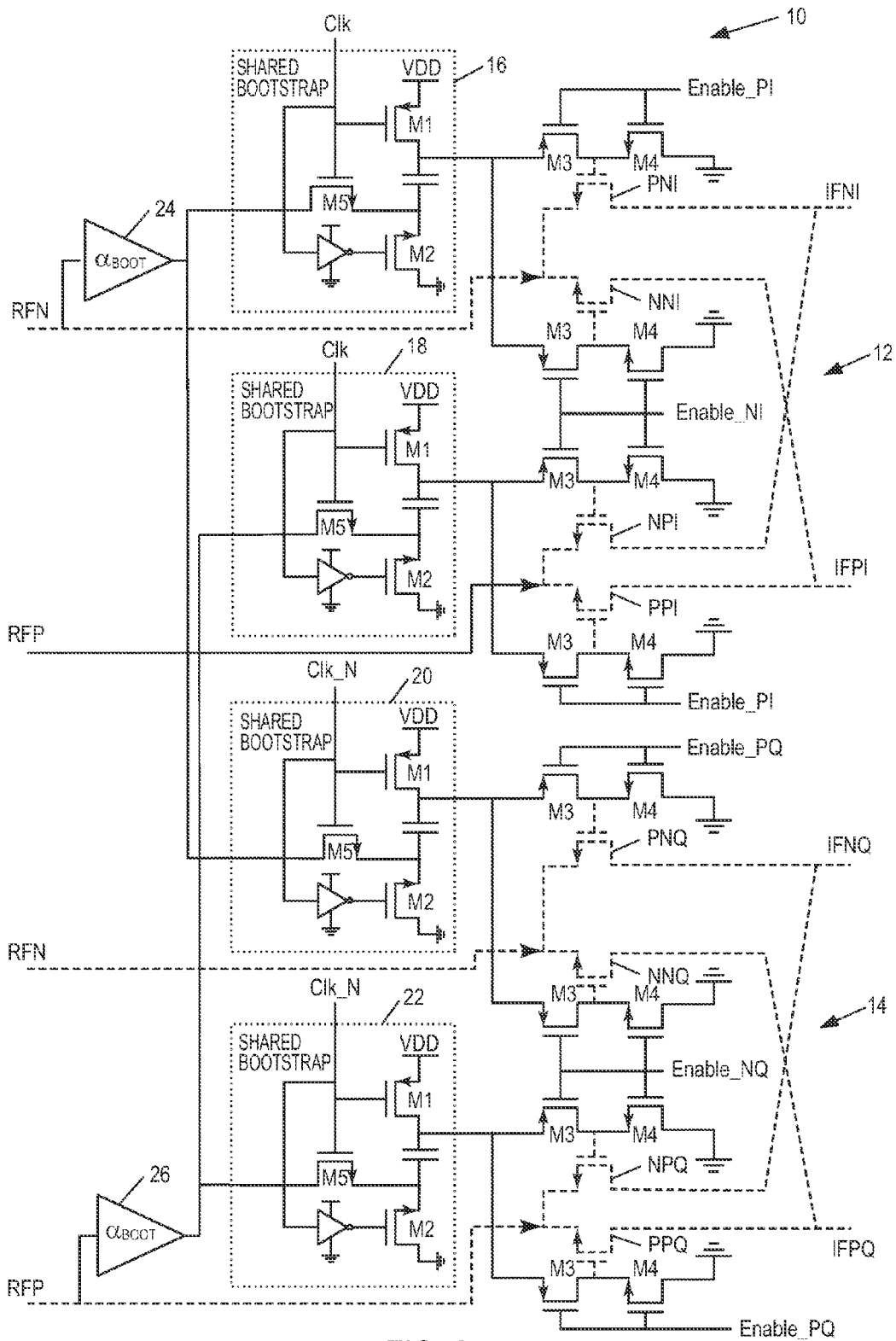
FIG. 6 is a schematic diagram of the IQ mixer circuit of FIG. 5, with the contents of the shared bootstrap circuits depicted.

FIG. 6 depicts the full IQ mixer 10, with the contents of the shared bootstrap circuits 16, 18, 20, 22 depicted. For simplicity, each shared bootstrap circuit 16, 18, 20, 22 is depicted with an inverter, so that transistors M1 and M2 receive the opposite of $V_{DD}$ and ground during each clock phase. Alternatively, in a given implementation, the clock signals Clk and Clk_N may be routed to each shared bootstrap circuits 16, 18, 20, 22 (as implied by FIGS. 3 and 5).

Figure 7:
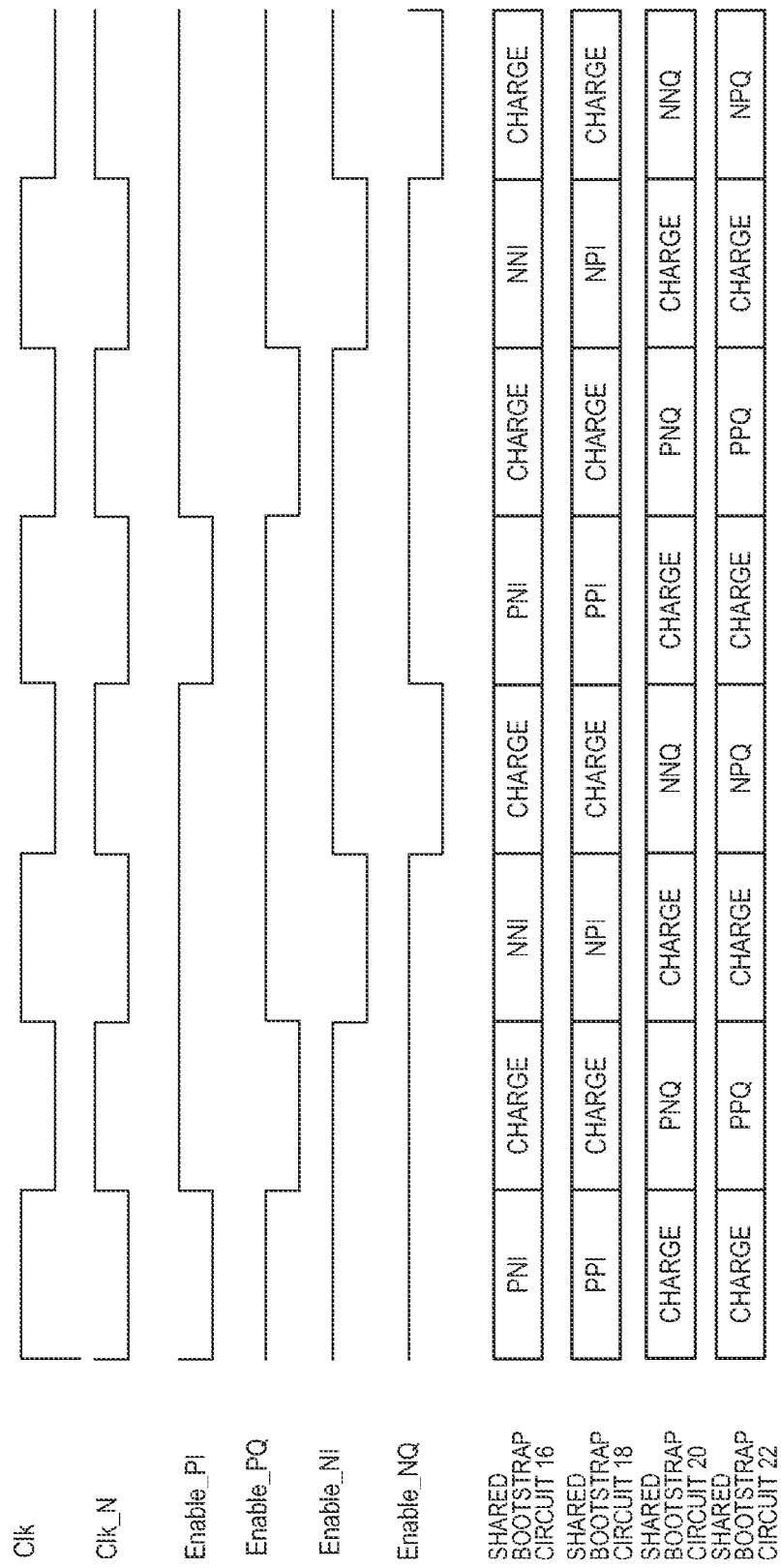
FIG. 7 is a timing diagram depicting clock and enable signals.

The IQ mixer 10 includes a clock generation circuit (not shown in FIGS. 5 and 6) operative to generate a clock signal Clk and its inverse Clk_N, and four individual enable signals Enable_PI, Enable_PQ, Enable_NI, and Enable_NQ. FIG. 7 depicts the outputs of the clock generation circuit, and the relationship between the clock signals and the four enable signals. Although denoted "enable" signals herein for ease of explanation, the enable signals perform the function of I and Q Local Oscillator (LO) clocks in a conventional mixer circuit—that is, they turn each mixing transistor "on" at the appropriate time, at a predetermined frequency. Each enable signal is active (e.g., low) during only one half-period out of every two successive full periods of the clock signal Clk. The enable signals are alternately active during successive half-periods, in a non-overlapping pattern.

The clock signals Clk and its inverse Clk_N have a frequency of twice the desired LO frequency. As depicted in FIG. 7, each enable signal is ¼ the frequency of the clock signals Clk, Clk_N, and hence half the LO frequency. However, as explained more fully herein, the enable signals operate in pairs to enable first the positive and then negative mixing transistors in each differential pair in a "ping-pong" fashion, hence switching the mixing transistors at effectively the LO frequency.

Below the clock and enable signals, FIG. 7 depicts the operation of each shared bootstrap circuit (SBC in FIG. 5) 16, 18, 20, 22, and which mixing transistor it bootstraps, during each half-cycle of the clock signals Clk, Clk_N. Initially, note that, as described above, the shared bootstrap circuits 16, 18 in the I mixer circuit 12, and the shared bootstrap circuits 20, 22 in the Q mixer circuit 14 charge their respective capacitors during opposite half-periods of the clock signal Clk, and bootstrap enabled mixing transistors by connecting the charged capacitor to their gate terminals during the other (also opposite) half-periods.

FIG. 7 also denotes which mixing transistor is bootstrapped by each shared bootstrap circuit 16, 18, 20, 22 during each respective bootstrap (i.e., not charging) half-period. In particular, during the half-period numbered 1 in FIG. 7, Enable_PI is active. This enables transistors M3 and M4 connected on the positive side of the differential pair connected to the negative mixer input in the I mixing circuit 12, thus enabling mixing transistor PNI. During half-period 1, the shared bootstrap circuit 16 connects its capacitor (charged to supply voltage $V_{DD}$ in the prior half-period) between the output of the buffer 24 and the gate terminal of the mixing transistor PNI. This bootstraps the mixing transistor, applying $\alpha_{BOOT}*V_{RFN}+V_{DD}$ to the gate terminal. In half-period 2, the shared bootstrap circuit 16 charges its capacitor to the supply voltage $V_{DD}$, and in half-period 3 it again connects the capacitor to the gate terminal of an enabled mixing transistor. In this case, Enable_NI is active, enabling the mixing transistor NNI. The shared bootstrap circuit 16 continues operation according to this pattern: bootstrap PNI—charge—bootstrap NNI—charge—bootstrap PNI—charge—bootstrap NNI . . . etc.

The shared bootstrap circuit 18 operates similarly, and in phase with the shared bootstrap circuit 18, to alternately bootstrap the mixing transistors of the positive differential pair in the I mixer circuit 12. However, the shared bootstrap circuit 18, sharing its capacitance with the differential pair of mixing transistors connected to the positive mixer input RFP, connects the capacitor between the output of buffer 26 and an enabled one of the mixing transistors NPI, PPI. These are enabled according to the signals Enable_NI and Enable_PI, respectively. The shared bootstrap circuit 18 operates according to the pattern: bootstrap PPI—charge—bootstrap NPI—charge—bootstrap PPI—charge—bootstrap NPI . . . etc.

Considering the shared bootstrap circuits 16, 18 together, they alternately bootstrap first the positive mixing transistor, and then the negative mixing transistor, of both differential pairs in the I mixing circuit 12, during every other half-period of the clock signal Clk (while charging their respective capacitors during the intervening half-periods).

In the Q mixing circuit 14, the shared bootstrap circuits 20, 22 operate similarly, but on the inverse clock signal Clk_N, and hence they charge their capacitors on opposite half-periods than do the shared bootstrap circuits 16, 18. In particular, the shared bootstrap circuit 20 charges its capacitor in half-period 1, and in the following half-period 2, it connects the charged capacitor between the output of buffer 24 and the gate terminal of an enabled one of the negative pair of mixing transistors PNQ, NNQ. In half-period 2, Enable_PQ is active, and hence the positive mixing transistor PNQ is bootstrapped, applying the voltage $\alpha_{BOOT}*V_{RFN}+V_{DD}$ to its gate terminal. After charging the capacitor to $V_{DD}$ in half-period 3, the shared bootstrap circuit 20 connects the charged capacitor between the output of buffer 24 and the gate terminal of the negative mixing transistor NNQ, enabled by the signal Enable_NQ, in half-period 4. The shared bootstrap circuit 16 continues operation according to this pattern: charge—bootstrap PNQ—charge—bootstrap NNQ—charge—bootstrap PNQ—charge—bootstrap NNQ . . . etc.

Finally, the shared bootstrap circuit 22 operates similarly, and in phase with the shared bootstrap circuit 20, to alternately bootstrap the mixing transistors of the positive differential pair in the Q mixer circuit 14. However, the shared bootstrap circuit 22, sharing its capacitance with the differential pair of mixing transistors connected to the positive mixer input RFP, connects the capacitor between the output of buffer 26 and an enabled one of the mixing transistors NPQ, PPQ. These are enabled according to the signals Enable_NQ and Enable_PQ, respectively. The shared bootstrap circuit 22 operates according to the pattern: charge—bootstrap PPQ—charge—bootstrap NPQ—charge—bootstrap PPQ—charge—bootstrap NPQ . . . etc.

Considering the shared bootstrap circuits 20, 22 together, they alternately bootstrap first the positive mixing transistor, and then the negative mixing transistor, of both differential pairs in the Q mixing circuit 14, during every other half-period of the clock signal Clk_N (while charging their respective capacitors during the intervening half-periods, which are opposite to the half-periods in which shared bootstrap circuits 16, 18 charge their capacitors).

The specific configuration and sequence of operation of the mixer circuit 10 described herein are not limiting. Those of skill in the art will readily realize that, e.g., the order of enabling the positive and negative mixing transistors in a differential pair may be reversed by connecting the enable signals in different order (or, which is the same thing, changing the order of the signal names in the timing diagram of FIG. 7). Furthermore, the invention is not limited to a passive IQ mixer in a receiver circuit, but may be advantageously applied to bootstrap any passive mixer architecture in either frequency up- or down-conversion, and on either or both RF and/or IF sides of the mixing transistors.

The mixer 10 of FIGS. 5 and 6 have inputs labeled RF and outputs labeled IF, implying a partial down-converting frequency converter. However, the labels are for reference only, and are not limiting. For example, the mixer could be a direct frequency conversion mixer, and the "IF" outputs may be baseband signals. Additionally, by swapping the output and input labels, the mixer circuit 10 becomes a partial or direct up-converting frequency converter, useful, for example, in a wireless communication device transmitter. In some applications, shared bootstrap circuits may be used to bootstrap the mixing transistors from the output side, either in lieu of or in addition to the input-side bootstrapping depicted in the embodiments described above. Those of skill in the art may readily devise the specific timing and operation of such output-side shared bootstrap circuits, given the teachings of the present disclosure. Although described herein primarily as a current driven passive mixer, the mixer may be configured to operate in voltage mode, e.g., by bootstrapping the output port.

Figure 1:
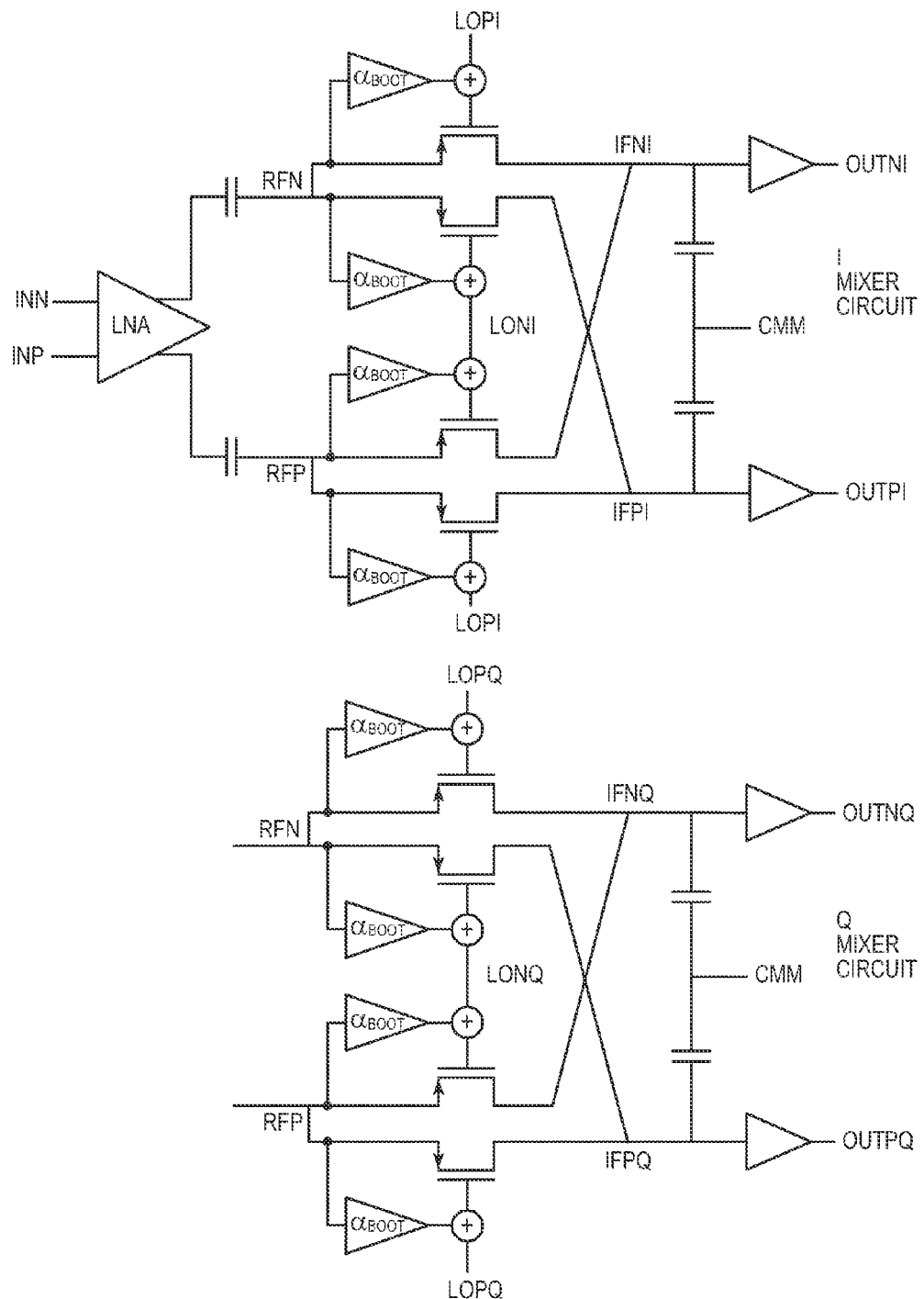
FIG. 1 is a schematic diagram of a prior art bootstrapped, passive, differential, IQ mixer circuit.
Figure 2:
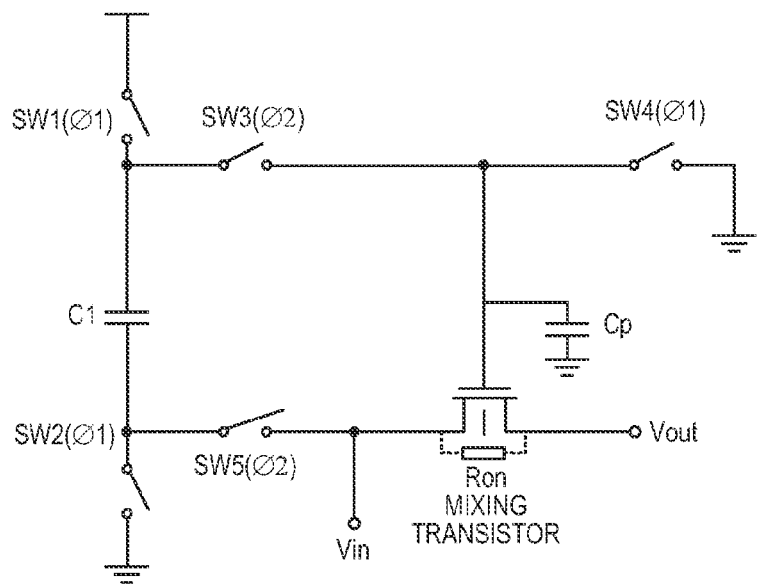
FIG. 2 is a conceptual diagram of a prior art bootstrap circuit for a transistor.

Comparing FIG. 6 to the prior art bootstrapped mixer of FIG. 1, one can see that the number of buffers—which are active circuits—is reduced from 8 to 2, yielding a nominal reduction of both power consumption and loading capacitance of 75%. Both the complexity of the bootstrap architecture and its silicon area are reduced. In particular, the number of transistor switches required is reduced from 40 to 28; the number of capacitances required is reduced from 8 to 4, and the number of buffers required is reduced from 8 to 2. Due to this dramatic drop in the required number of active circuits, power consumption is significantly reduced, as is the capacitive load at the mixer input, which is responsible for signal attenuation and band reduction. The sources of mismatch are additionally reduced, improving SNDR and performance. According to embodiments of the present invention, the linearity of a passive mixer may be improved—improving in particular its second order intermodulation distortion performance—by an optimized bootstrapping solution that reduces silicon area, power consumption, circuit complexity, sources of component mismatch, and capacitive load at the mixer input, as compared to prior art bootstrap implementations.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A bootstrapped, passive, differential, frequency conversion IQ mixer comprising:
    two buffers having a predetermined gain, each connected to one of positive and negative differential mixer inputs;
    differential In-phase, I, and Quadrature, Q, mixer circuits, each comprising
        two differential pairs of mixing transistors, each pair comprising a positive mixing transistor and a negative mixing transistor; and
        two shared bootstrap circuits, each including a capacitor and each being interposed between a different buffer and one pair of mixing transistors;
    wherein the shared bootstrap circuits in the I mixer circuit are each operative to charge their capacitor during each first half-period of a clock signal and, during each second half-period of the clock signal, to bootstrap an enabled one of the mixing transistors of the connected pair by connecting the charged capacitor between the connected buffer and a gate terminal of the enabled mixing transistor;
    wherein the shared bootstrap circuits in the Q mixer circuit are each operative to charge their capacitor during each second half-period of the clock signal and, during each first half-period of the clock signal, to bootstrap an enabled one of the mixing transistors of the connected pair by connecting the charged capacitor between the connected buffer and a gate terminal of the enabled mixing transistor; and
    wherein, during each alternate half-period of the clock signal in which the connected shared bootstrap circuit is not charging its capacitor, first the positive mixing transistors of the two pair in each of the I and Q mixer circuits are enabled, and then both negative mixing transistors of the two pair in each of the I and Q mixer circuits are enabled.

2. The mixer of claim 1 wherein the clock signal is twice the frequency of a local oscillator signal.

3. The mixer of claim 1 further comprising a clock generation circuit operative to generate the clock signal and further operative to generate, for each two consecutive periods of the clock, comprising four consecutive half-periods:
    a first enable signal, active only during a first half-period of the clock, and operative to enable the positive mixing transistors of the two pair in the I mixer circuit;
    a second enable signal, active only during a second half-period of the clock, and operative to enable the negative mixing transistors of the two pair in the I mixer circuit;
    a third enable signal, active only during a third half-period of the clock, and operative to enable the positive mixing transistors of the two pair in the Q mixer circuit; and
    a fourth enable signal, active only during a fourth half-period of the clock, and operative to enable the negative mixing transistors of the two pair in the Q mixer circuit.

4. The mixer of claim 1, wherein charging a capacitor comprises charging the capacitor to a supply voltage value.

5. The mixer of claim 1, wherein bootstrapping an enabled mixing transistor applies to the gate terminal of the mixing transistor the sum of a mixer input voltage value, boosted by the predetermined buffer gain, and the supply voltage on the capacitor.

6. The mixer of claim 1, wherein the predetermined buffer gain value is 0.5.

7. The mixer of claim 1, wherein the mixer input is a higher frequency signal than the mixer outputs, and the mixer is a down-converting frequency converter.

8. The mixer of claim 1, wherein the mixer input is a lower frequency signal than the mixer outputs, and the mixer is an up-converting frequency converter.

9. The mixer of claim 1, wherein the bootstrapped, passive, differential, frequency conversion IQ mixer is current driven.

10. The mixer of claim 1, wherein the bootstrapped, passive, differential, frequency conversion IQ mixer operates in voltage mode.

11. A bootstrapped, passive, differential, frequency conversion IQ mixer having differential inputs, differential In-phase, I, outputs, and differential Quadrature, Q, outputs, comprising:
  a first pair of mixing transistors arranged in a differential configuration and receiving a negative mixer input and generating differential I outputs;
  a second pair of mixing transistors arranged in a differential configuration and receiving a positive mixer input and generating differential I outputs;
  a third pair of mixing transistors arranged in a differential configuration and receiving a negative mixer input and generating differential Q outputs;
  a fourth pair of mixing transistors arranged in a differential configuration and receiving a positive mixer input and generating differential Q outputs;
  a first buffer having a predetermined gain and connected to the negative mixer input;
  a second buffer having the predetermined gain and connected to the positive mixer input;
  a clock generator circuit operative to generate a clock signal having first and second half-periods, of opposite polarity, during each period;
  a first shared bootstrap circuit comprising a first capacitor, and operative to charge the first capacitor to a supply voltage value during the first half-period the clock signal, and operative to connect the first capacitor between the first buffer and a gate terminal of an enabled one of the first pair of mixing transistors during the second half-period of the clock signal;
  a second shared bootstrap circuit comprising a second capacitor, and operative to charge the second capacitor to the supply voltage value during the first half-period of the clock signal, and operative to connect the second capacitor between the second buffer and a gate terminal of an enabled one of the second pair of mixing transistors during the second half-period of the clock signal;
  a third shared bootstrap circuit comprising a third capacitor, and operative to charge the third capacitor to the supply voltage value during the second half-period of the clock signal, and operative to connect the third capacitor between the first buffer and a gate terminal of an enabled one of the third pair of mixing transistors during the first half-period of the clock signal;
  a fourth shared bootstrap circuit comprising a fourth capacitor, and operative to charge the fourth capacitor to the supply voltage value during the second half-period of the clock signal, and operative to connect the fourth capacitor between the second buffer and a gate terminal of an enabled one of the fourth pair of mixing transistors during the first half-period of the clock signal;
  wherein the clock generator circuit is further operative to generate first, second, third, and fourth enable signals, each active for one different half-period of every two successive periods of the clock signal;
  wherein the first enable signal is operative to alternately enable a positive mixing transistor of the first pair and the second pair;
  wherein the second enable signal is operative to alternately enable a negative mixing transistor of the first pair and the second pair;
  wherein the third enable signal is operative to alternately enable a positive mixing transistor of the third pair and the fourth pair; and
  wherein the fourth enable signal is operative to alternately enable a negative mixing transistor of the third pair and the fourth pair.

12. The mixer of claim 11, wherein the bootstrapped, passive, differential, frequency conversion IQ mixer is current driven.

13. The mixer of claim 11, wherein the bootstrapped, passive, differential, frequency conversion IQ mixer operates in voltage mode.

14. A method of operating a bootstrapped, passive, differential, frequency conversion IQ mixer comprising first and second shared bootstrap circuits in an In-phase, I, mixing circuit, and third and fourth shared bootstrap circuits in a Quadrature, Q, mixing circuit, wherein each shared bootstrap circuit includes a capacitor and is connected between one of two input buffers and one of four differential pairs of mixing transistors, comprising:
  during a first half-period of a clock signal, simultaneously configuring the first and second shared bootstrap circuits to charge their respective capacitors and the third and fourth shared bootstrap circuits to connect their capacitors between the connected buffer and a gate terminal of an enabled one of the connected mixing transistors;
  during an opposite, second half-period of the clock signal, simultaneously configuring the first and second shared bootstrap circuits to connect their capacitors between the connected buffer and a gate terminal of an enabled one of the connected mixing transistors and the third and fourth shared bootstrap circuits to charge their respective capacitors; and
  during each alternate half-period of the clock signal in which the connected shared bootstrap circuit is not charging its capacitor, enabling first the positive mixing transistors of the two pair in each of the I and Q mixer circuits, and then enabling both negative mixing transistors of the two pair in each of the I and Q mixer circuits.

15. A bootstrapped mixer having differential mixer inputs, comprising:
  at least eight mixing transistors, arranged in differential pairs;
  at least four shared bootstrap circuits, each including a capacitor and being connected to a different pair of mixing transistors;
  a clock generating circuit operative to generate a clock signal and at least four independent, sequentially active phases of a Local Oscillator signal, each phase active for a half-period of the clock signal;
  wherein a first plurality of the shared bootstrap circuits are each operative to charge their capacitor during each first half-period of the clock signal and during each second half-period of the clock signal, to bootstrap an enabled one of the mixing transistors of the connected pair by connecting the charged capacitor between a mixer input and the gate terminal of the enabled mixing transistor;

wherein a second plurality of the shared bootstrap circuits are each operative to charge their capacitor during each second half-period of the clock signal and during each first half-period of the clock signal, to bootstrap an enabled one of the mixing transistors of the connected pair by connecting the charged capacitor between a mixer input and the gate terminal of the enabled mixing transistor; and wherein first one, and then the other, mixing transistor of each pair are alternately enabled during the half-period of the clock signal in which the connected shared bootstrap circuit is not charging its capacitor.

16. The mixer of claim 15 further comprising at least two buffers, each having the same predetermined gain, each connected to a different mixer input and each connected to at least two shared bootstrap circuits, and wherein bootstrapping an enabled mixing transistor by connecting the charged capacitor between a mixer input and the gate terminal of the enabled mixing transistor comprises connecting the charged capacitor between a buffer output and the gate terminal of the enabled mixing transistor.

* * * * *